United States Patent
Muchherla et al.

(10) Patent No.: US 11,823,748 B2
(45) Date of Patent: *Nov. 21, 2023

(54) VOLTAGE BIN CALIBRATION BASED ON A TEMPORARY VOLTAGE SHIFT OFFSET

(71) Applicant: Micron Technology, Inc., Boise, ID (US)

(72) Inventors: Kishore Kumar Muchherla, Fremont, CA (US); Karl Schuh, Santa Cruz, CA (US); Mustafa N Kaynak, San Diego, CA (US); Xiangang Luo, Fremont, CA (US); Shane Nowell, Boise, ID (US); Devin Batutis, San Jose, CA (US); Sivagnanam Parthasarathy, Carlsbad, CA (US); Sampath Ratnam, Boise, ID (US); Jiangang Wu, Milpitas, CA (US); Peter Feeley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/820,792

(22) Filed: Aug. 18, 2022

(65) Prior Publication Data

US 2022/0392547 A1 Dec. 8, 2022

Related U.S. Application Data

(63) Continuation of application No. 17/230,786, filed on Apr. 14, 2021, now Pat. No. 11,437,108.

(51) Int. Cl.
G11C 16/34 (2006.01)
G11C 16/30 (2006.01)
(Continued)

(52) U.S. Cl.
CPC ............ *G11C 16/30* (2013.01); *G11C 7/04* (2013.01); *G11C 16/102* (2013.01); *G11C 16/26* (2013.01);
(Continued)

(58) Field of Classification Search
CPC ......... G11C 16/30; G11C 7/04; G11C 16/102; G11C 16/26; G11C 16/32; G11C 16/34;
(Continued)

(56) References Cited

U.S. PATENT DOCUMENTS 11,217,320 B1 1/2022 Sheperek et al.
11,222,704 B1 1/2022 Rayaprolu
(Continued)

OTHER PUBLICATIONS

International Search Report and Written Opinion for International Application No. PCT/US2022/024675, dated Jul. 8, 2022, 9 Pages.

*Primary Examiner* — Jay W. Radke
(74) *Attorney, Agent, or Firm* — Lowenstein Sandler LLP

(57) ABSTRACT

A voltage shift for memory cells of a block family at a memory device is measured. The block family is associated with a first voltage offset. An adjusted amount of voltage shift is determined for the memory cells based on the measured voltage shift and a temporary voltage shift offset associated with a difference between a current temperature and a prior temperature for the memory device. The block family is associated with a second voltage offset in view of the adjusted voltage shift.

20 Claims, 11 Drawing Sheets

(51) Int. Cl.
  *G11C 16/10*    (2006.01)
  *G11C 7/04*     (2006.01)
  *G11C 16/32*    (2006.01)
  *G11C 16/26*    (2006.01)

(52) U.S. Cl.
  CPC .............. *G11C 16/32* (2013.01); *G11C 16/34* (2013.01); *G11C 16/3427* (2013.01)

(58) Field of Classification Search
  CPC ........ G11C 16/3427; G11C 2029/4402; G11C 16/3418; G11C 29/021; G11C 29/028; G11C 29/46; G11C 16/10
  See application file for complete search history.

(56) References Cited

U.S. PATENT DOCUMENTS

| | | | |
|---|---|---|---|
| 11,437,108 B1 * | 9/2022 | Muchherla | G11C 7/04 |
| 2014/0334228 A1 | 11/2014 | Kim et al. | |
| 2015/0339057 A1 | 11/2015 | Choi et al. | |
| 2017/0271031 A1 | 9/2017 | Sharon et al. | |
| 2017/0287567 A1 | 10/2017 | Cai et al. | |
| 2019/0362796 A1 | 11/2019 | Choi et al. | |
| 2022/0057935 A1 | 2/2022 | Sheperek et al. | |
| 2022/0059179 A1 | 2/2022 | Sheperek et al. | |
| 2022/0059181 A1 | 2/2022 | Sheperek et al. | |
| 2022/0066639 A1 | 3/2022 | Sheperek et al. | |
| 2022/0066930 A1 | 3/2022 | Sheperek et al. | |
| 2022/0084596 A1 | 3/2022 | Sheperek et al. | |
| 2022/0084605 A1 | 3/2022 | Muchherla et al. | |
| 2022/0108752 A1 | 4/2022 | Sheperek et al. | |
| 2022/0115079 A1 | 4/2022 | Sheperek et al. | |

* cited by examiner

FIG. 10A

| CROSS TEMPERATURE DIFFERENCE 812 | TEMPORARY VOLTAGE SHIFT OFFSET 814 |
|---|---|
| + 50 C | - 30 mV |

| FIRST TEMPERATURE 1010 | 20 C |
| SECOND TEMPERATURE 1012 | 70 C |
| TEMPORARY VOLTAGE SHIFT 1014 | 40 mV |
| EXPECTED/ACTUAL VOLTAGE SHIFT 1016 | 10 mV |

FIG. 10B

| CROSS TEMPERATURE DIFFERENCE 812 | TEMPORARY VOLTAGE SHIFT OFFSET 814 |
|---|---|
| + 50 C | - 30 mV |
| + 53 C | - 31 mV |

| THIRD TEMPERATURE 1018 | 15 C |
| FOURTH TEMPERATURE 1020 | 68 C |
| MEASURED VOLTAGE SHIFT 1022 | 35 mV |
| ADJUSTED VOLTAGE SHIFT 1024 | 5 mV | ions
VOLTAGE BIN CALIBRATION BASED ON A TEMPORARY VOLTAGE SHIFT OFFSET

RELATED APPLICATIONS

This application is a continuation of U.S. patent application Ser. No. 17/230,786, filed Apr. 14, 2021, the entire contents of which is hereby incorporated by reference herein.

TECHNICAL FIELD

Embodiments of the disclosure relate generally to memory sub-systems, and more specifically, relate to voltage bin calibration based on a temporary voltage shift offset.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIGS. 10A-10B illustrate another example of determining an adjusted voltage shift for memory cells using a cross-temperature voltage shift offset, in accordance with some embodiments of the present disclosure.

DETAILED DESCRIPTION

Figure 1:
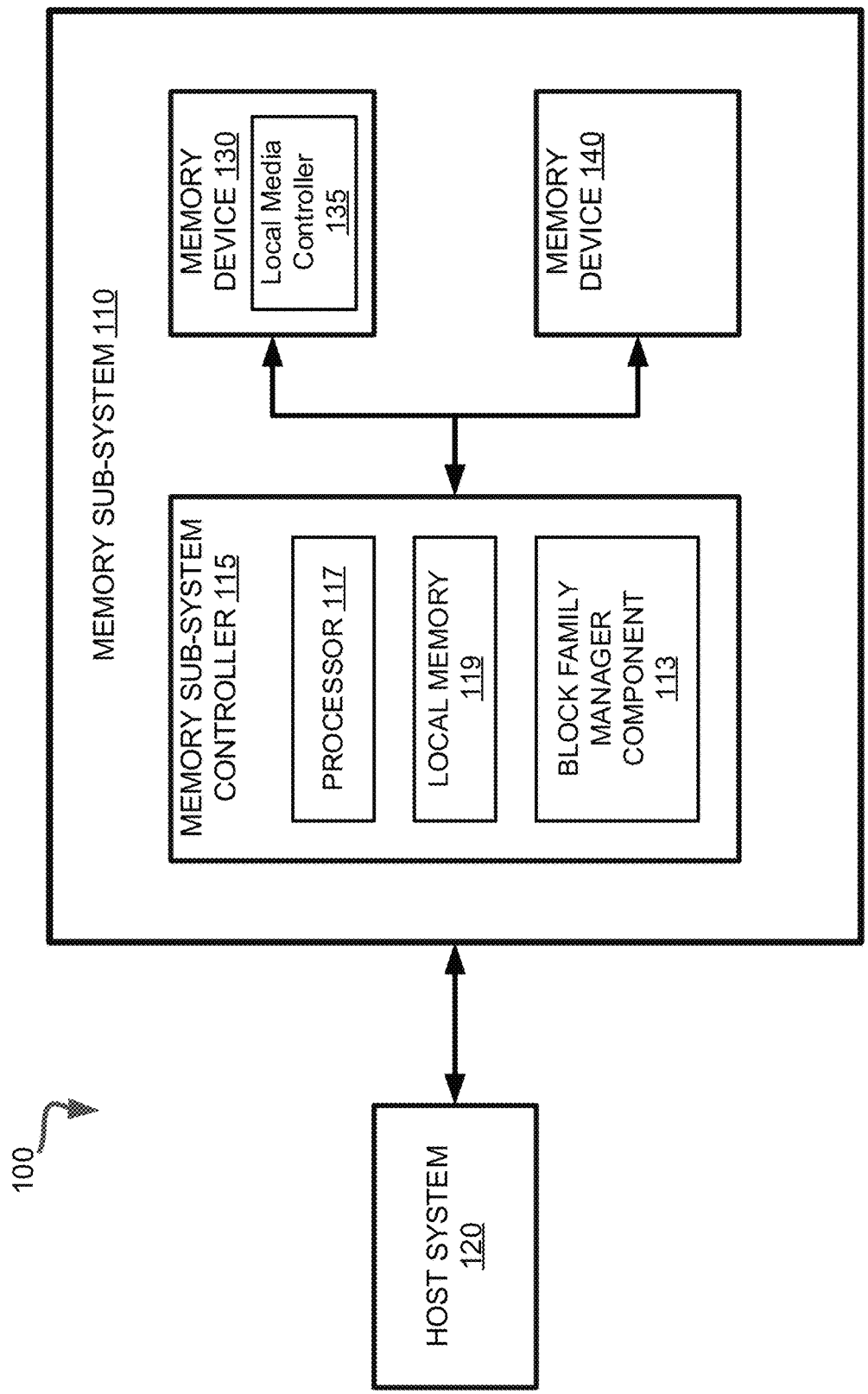
FIG. 1 illustrates an example computing system that includes a memory sub-system, in accordance with some embodiments of the present disclosure.

Aspects of the present disclosure are directed to voltage bin calibration based on a temporary voltage shift offset. A memory sub-system can be a storage device, a memory module, or a combination of a storage device and memory module. Examples of storage devices and memory modules are described below in conjunction with FIG. 1. In general, a host system can utilize a memory sub-system that includes one or more memory components, such as memory devices that store data. The host system can provide data to be stored at the memory sub-system and can request data to be retrieved from the memory sub-system.

A memory sub-system can utilize one or more memory devices, including any combination of the different types of non-volatile memory devices and/or volatile memory devices, to store the data provided by the host system. In some embodiments, non-volatile memory devices can be provided by negative-and (NAND) type flash memory devices. Other examples of non-volatile memory devices are described below in conjunction with FIG. 1. A non-volatile memory device is a package of one or more dice. Each die can consist of one or more planes. Planes can be groups into logic units (LUN). For some types of non-volatile memory devices (e.g., NAND devices), each plane consists of a set of physical blocks. Each block consists of a set of pages. "Block" herein shall refer to a set of contiguous or non-contiguous memory pages. An example of a "block" is an "erasable block," which is the minimal erasable unit of memory, while "page" is a minimal writable unit of memory. Each page includes a set of memory cells. A memory cell is an electronic circuit that stores information.

Data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system. The data to be read or written, as specified by a host request, is hereinafter referred to as "host data." A host request can include logical address information (e.g., logical block address (LBA), namespace) for the host data, which is the location the host system associates with the host data. The logical address information (e.g., LBA, namespace) can be part of metadata for the host data. Metadata can also include error handling data (e.g., ECC codeword, parity code), data version (e.g. used to distinguish age of data written), valid bitmap (which LBAs or logical transfer units contain valid data), etc.

A memory device includes multiple memory cells, each of which can store, depending on the memory cell type, one or more bits of information. A memory cell can be programmed (written to) by applying a certain voltage to the memory cell, which results in an electric charge being held by the memory cell, thus allowing modulation of the voltage distributions produced by the memory cell. Moreover, precisely controlling the amount of the electric charge stored by the memory cell allows to establish multiple threshold voltage levels corresponding to different logical levels, thus effectively allowing a single memory cell to store multiple bits of information: a memory cell operated with $2^n$ different threshold voltage levels is capable of storing n bits of information. "Threshold voltage" herein shall refer to the voltage level that defines a boundary between two neighboring voltage distributions corresponding to two logical levels. Thus, a read operation can be performed by comparing the measured voltage exhibited by the memory cell to one or more reference voltage levels in order to distinguish between two logical levels for single-level cells and between multiple logical levels for multi-level cells.

Due to the phenomenon known as slow charge loss or SCL (also referred to as storage charge loss or system charge loss), the threshold voltage of a memory cell changes in time as the electric charge of the cell is degrading, which is referred to as "temporal voltage shift" (since the degrading electric charge causes the voltage distributions to shift along the voltage axis towards lower voltage levels). The threshold voltage is changing rapidly at first (immediately after the memory cell was programmed), and then slows down in an approximately logarithmic linear fashion with respect to the time elapsed since the cell programming event. Accordingly, failure to mitigate the temporal voltage shift caused by the slow charge loss can result in the increased bit error rate in read operations.

However, various common implementations either fail to adequately address the temporal voltage shift or employ inefficient strategies resulting in high bit error rates and/or exhibiting other shortcomings. Embodiments of the present disclosure address the above-noted and other deficiencies by implementing a memory sub-system that employs block family based error avoidance strategies, thus significantly improving the bit error rate exhibited by the memory sub-system.

In accordance with embodiments of the present disclosure, the temporal voltage shift is selectively tracked for a programmed set of memory cells grouped by block families, and appropriate voltage offsets, which are based on block affiliation with a certain block family, are applied to the base read levels in order to perform read operations. "Block family" herein shall refer to a possibly noncontiguous set of memory cells (which can reside in one or more full and/or partial blocks, the latter referred to as "partitions" herein) that have been programmed within a specified time window and a specified temperature window, and thus are expected to exhibit similar or correlated changes in their respective data state metrics for slow charge loss. A block family can be made with any granularity containing only whole codewords, whole pages, whole super pages, or whole superblocks, or any combination of these. "Data state metric" herein shall refer to a quantity that is measured or inferred from the state of data stored on a memory device. Specifically, the data state metrics can reflect the state of the temporal voltage shift, the degree of read disturb, and/or other measurable functions of the data state. A composite data state metric is a function (e.g., a weighted sum) of a set of component state metrics.

In these embodiments, a block family experiences a specified temperature range using an aggregate temperature, which can change or be defined according to a temperature metric in different embodiments. For example, in response to a timer reaching a soft closure value, a controller of the memory sub-system can perform a soft closure of the block family (i.e., signal to a block family manager that the open time for the block is coming to an end and prepare for a hard closure of the block family). Or, alternatively, in response to an aggregate temperature (based on temperature values received from temperature sensor(s) of the memory device) being greater than or equal to a specified threshold temperature, the controller can likewise perform a soft closure of the block family.

After performing the soft closure, the memory sub-system can continue to program to a partially written block until the timer reaches a hard closure value or the block family satisfies a hard closure criteria. In this way, the memory sub-system has an extension time before the hard closure during which to complete writing to the partially written block, decide whether to partition the block, or to write dummy data to the unwritten portion of the block after hard closure. After hard closure of one block family (i.e., the memory sub-system controller no longer writes data to the block family), further programming to dice of the memory device is to a newly opened block family. Given that wear-leveling keeps block to similar program erase counts, the time elapsed after programming and temperature are the main factors affecting the temporal voltage shift, all blocks and/or partitions within a single block family are presumed to exhibit similar distributions of threshold voltages in memory cells, and thus would require the same voltage offsets to be applied to the base read levels for read operations to account for SCL. "Base read level" herein shall refer to the initial threshold voltage level exhibited by the memory cell immediately after programming. In some implementations, base read levels can be stored in the metadata of the memory device.

Block families can be created asynchronously with respect to block programming events. In an illustrative example, a new block family can be created whenever a specified period of time (e.g., a predetermined number of minutes) has elapsed since creation of the last block family or the reference temperature of memory cells has changed by more than a specified threshold value. The memory sub-system controller can maintain an identifier of the active block family, which is associated with one or more blocks as they are being programmed.

The memory sub-system controller can periodically perform a calibration process (e.g., a calibration scan) to associate each die of every block family with one of the predefined threshold voltage offset bins (referred to as voltage bins), which is in turn associated with the voltage offsets to be applied for read operations. In one embodiment, the associations of pages or blocks with block families, and block families and dies with voltage bins, can be represented by metadata stored in respective metadata tables maintained by the memory sub-system controller. In some instances, the memory sub-system controller can perform the calibration process by determining an amount of shift of a memory access voltage distribution between a time period that the calibration process is performed for a block family (i.e., a current time period) and a prior time period (e.g., a time period that data for the block family was programmed to the memory device). The amount of shift of the memory access voltage distribution (also referred to as a voltage shift) can correspond to a threshold voltage offset that is previously determined to minimize the error rate of operations, such as read operations, performed for the block family. The memory sub-system controller can determine the particular voltage bin that corresponds to the threshold voltage offset and update metadata for the block family to correspond to the determined voltage bin.

Due to varying environmental conditions, an operating temperature of a memory device at the current time period can be different from the operating temperature of the memory device at the prior time period. The difference in the operating temperature of the memory device between the time at which the memory page is programmed and the time at which the memory page is accessed or calibrated is referred to as a cross-temperature. The operating temperature of the memory device at a given time period can impact an amount of slow charge loss exhibited by memory cells of the memory device during that time period. Accordingly, memory cells of a memory page that is associated with a large cross-temperature can exhibit a different amount of voltage distribution shift, compared to memory cells of a memory page that is associated with a small cross-temperature.

In addition, a memory device can experience one or more temporary temperature swings during the overall lifetime of the memory device. For example, a memory device can operate at a first temperature for a significant portion (e.g., 90%, 95%, etc.) of the memory device lifetime and, for a small portion (e.g., 5%, 10%, etc.) of the memory device lifetime, an operating temperature of the memory device can deviate from the first temperature to other temperatures. A memory sub-system controller can program a block family while the memory device is operating at a first temperature and can initiate a calibration process for the block family while the memory device is experiencing the temporary temperature swing (i.e., the memory device is temporarily operating at a second temperature). Additionally or alternatively, the memory sub-system controller can program the block family while the memory device is subject to the temporary temperature swing and can initiate the calibration process while the memory device is operating at the first temperature.

In some instances, at the time the calibration process is initiated, memory pages of the block family can be associated with a large cross-temperature and, accordingly, memory cells of the memory page can exhibit a different amount of voltage distribution shift compared to the other memory pages within the block family that did not experience the large cross-temperature. In an illustrative example, a block family can be created and data for a first block (block A) can be programmed to a memory device when an operating temperature for the memory sub-system is approximately 80 degrees Celsius (C). Within 10 minutes after block A is programmed, the operating temperature of the memory sub-system can drop to approximately 30° C. At or around this time period, data for a second block (block B) of the block family can be programmed. The block family can be closed when the operating temperature for the memory sub-system is approximately 30° C. As block A was programmed when the operating temperature was approximately 80° C., the cross-temperature associated with block A is approximately 50° C. However, as block B was programmed when the operating temperature was approximately 30° C., the cross-temperature associated with block B is approximately 0° C. As a result, block A can exhibit a different SCL during a lifetime of the memory sub-system than block B, even though block B is included in the same block family as block A.

Based on the calibration process, the memory sub-system controller can assign the block family to a voltage bin that is associated with a large threshold voltage offset to address the large amount of voltage distribution shift exhibited by the memory cells. In other or similar instances, the memory cells of the memory device can have a large amount of voltage distribution shift (e.g., based on an amount of time that has passed since the memory sub-system controller has programmed the memory cells) and the temporary temperature swing can cause the memory cells to exhibit a small amount of voltage distribution shift. Based on the calibration process, the memory sub-system controller can assign the block family to a voltage bin that is associated with a small threshold voltage offset in view of the small amount of voltage distribution shift exhibited by the memory cells.

As the large (or small) amount of voltage distribution shift exhibited by the memory cells is based on a memory page cross-temperature caused by a temporary condition of the memory device, the threshold voltage offset assigned to the block family may not be an accurate threshold voltage offset for a significant portion of time between calibration processes for the block family. For example, if the memory sub-system controller initiates the calibration process for the block family during the temporary temperature swing, the memory device can return to the first temperature shortly after the calibration process is completed. Accordingly, the threshold voltage offset assigned to the block family based on the large voltage distribution shift exhibited by memory cells can be inaccurate, as shortly after the assignment, the memory device can return to the first temperature and the cross temperature for the memory page (as well as the voltage distribution shift exhibited by the memory cells) can decrease significantly for the remaining time period before a subsequent calibration process is initiated. As the memory sub-system controller applies the threshold voltage offset assigned during the temporary temperature swing to the block family, a significant number of errors can result. The significant number of errors for the block family can reduce an overall performance rating (e.g., bit error rating, etc.) for the memory device. Additionally, the memory sub-system controller can perform a significant number of error control operations to correct the errors caused on the large voltage offset, which can consume a significant amount of system resources. As a result, on overall system latency is increased and an overall system efficiency is decreased.

Aspects of the present disclosure address the above and other deficiencies by calibrating voltage bins at a memory device based on a cross-temperature voltage shift offset. During a calibration scan for a block family, a memory sub-system controller can determine a difference in an operating temperature of the memory device at the time period of the calibration scan (i.e., the current time period) and an operating temperature of the memory device at a prior time period. For example, the memory sub-system controller can determine the temperature of the memory device at a time period during which the memory page is programmed (i.e., an initial time period) and the operating temperature of the memory device at the current time period. The memory sub-system controller can identify a temporary voltage shift offset for the memory device (e.g., via a temporary voltage shift offset data structure) based on the determined operating temperature difference. The temporary voltage shift offset corresponds to an amount of voltage shift exhibited by memory cells of a memory page during a temporary temperature swing of the memory device. In some embodiments, the temporary voltage shift offset is defined based on experimental data collected for the memory device prior to installation and/or initialization of the memory device at the memory sub-system. In other or similar embodiments, the memory sub-system controller can generate the temporary voltage shift offset based on an amount of voltage shift exhibited by memory cells of other memory pages of other block families during temporary temperature swings of the memory device.

The memory sub-system controller can perform a calibration operation to measure an amount of voltage shift for memory cells of the memory page at the current time period and can apply the temporary voltage shift offset to the measured amount of voltage shift to obtain an adjusted amount of voltage shift for the memory cells. The adjusted amount of voltage shift can correspond to an amount of voltage shift that is expected for the memory cells if the memory device is not subject to a temporary condition, such as a temporary temperature swing. The expected amount of voltage shift can correspond to an amount of voltage shift that is expected to occur between the current time period and the prior time period based on the phenomena of slow charge loss. The memory sub-system controller can assign the block family including the memory page to a respective voltage bin of a set of voltage bins for the memory device that is associated with a voltage offset corresponding to the adjusted amount of voltage shift.

Advantages of the present disclosure include, but are not limited to, reducing the number of errors that can occur after a calibration process is performed for a memory device during a temporary temperature swing. By applying the temporary voltage shift offset to a measured amount of voltage shift, the memory sub-system controller can obtain an adjusted amount of voltage shift that accurately reflects the voltage shift for memory pages of the block family during a significant portion of time between calibration processes. Accordingly, the memory sub-system controller can assign the block family to a voltage bin associated with a threshold voltage that is accurate for the block family for the significant portion of time between calibration processes. As the memory sub-system controller applies the accurate threshold voltage during memory access operations for the block family, the number of errors that occur during the memory access operations is significantly reduced, causing the overall performance rating for the memory sub-system to increase. Additionally, a smaller number of error correction operations are performed to correct errors for the block family, increasing the amount of system resources available for other memory sub-system processes. As a result, an overall system latency for the system decreases and an overall system efficiency for the system increases.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 132) on the die and a controller (e.g., memory sub-system controller 115) for media management within the same memory device package. An example of a managed memory device is a managed NAND (MNAND) device.

The memory sub-system 110 includes a block family manager component 113 that can select threshold voltage offset bins (referred to as voltage bins or bins) to be associated with block families at a memory device. In some embodiments, the memory sub-system controller 115 includes at least a portion of the block family manager component 113. For example, the memory sub-system controller 115 can include a processor 117 (processing device) configured to execute instructions stored in local memory 119 for performing the operations described herein. In some embodiments, the block family manager component 113 is part of the host system 120, an application, or an operating system. Further details regarding block families and block family manager component 113 are described below.

Figure 2:
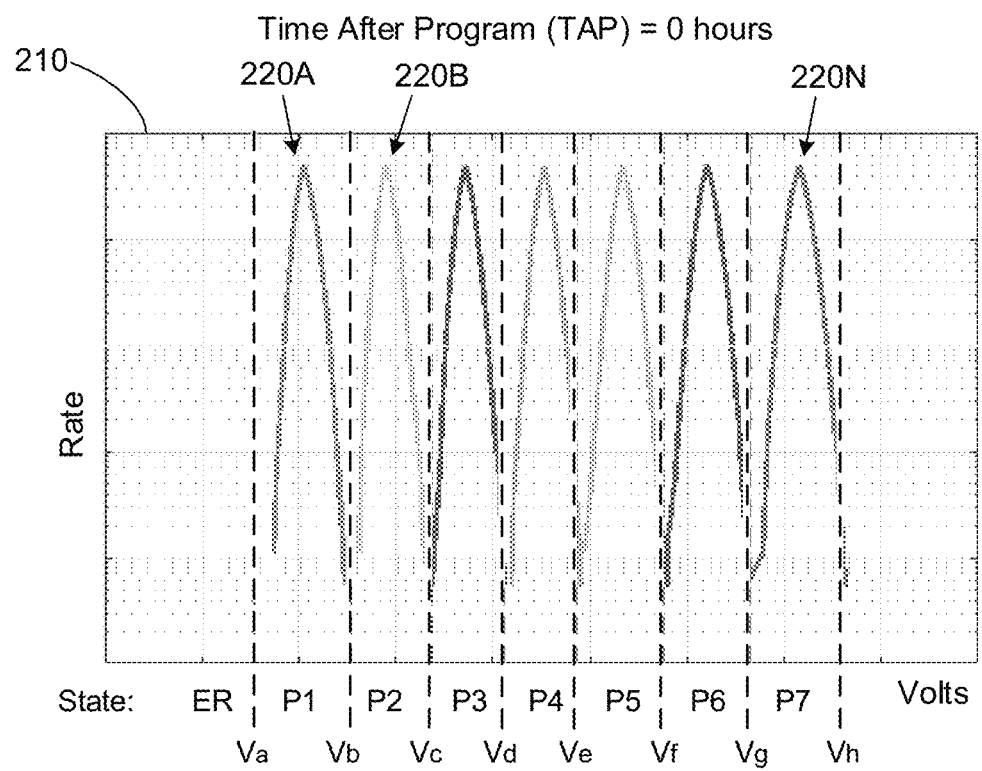
FIG. 2 schematically illustrates the temporal voltage shift caused by the slow charge loss exhibited by triple-level memory cells, in accordance with some embodiments of the present disclosure.
Figure 2:
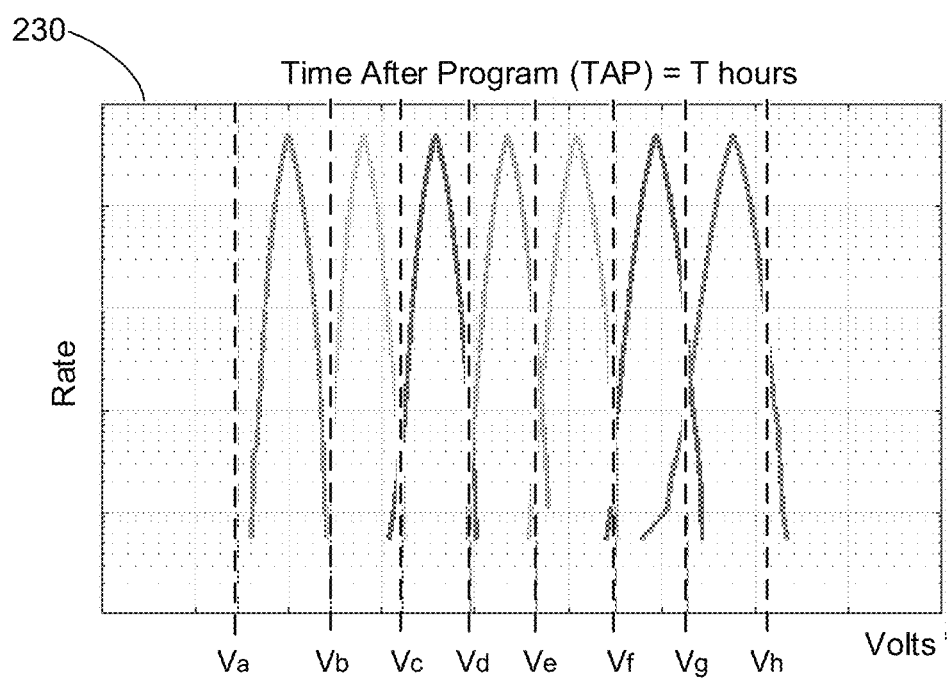

FIG. 2 schematically illustrates the temporal voltage shift caused by the slow charge loss exhibited by triple-level memory cells, in accordance with some embodiments of the present disclosure. While the illustrative example of FIG. 2 utilizes triple-level cells, the same observations can be made and, accordingly, the same remedial measures are applicable to single level cells and multi-level cells, as well as any other fractional or whole number of bits per cell (e.g., 3.5 bits per cell, etc.), in order to compensate for the slow charge loss.

As noted above, a memory cell can be programmed (written to) by applying a certain voltage to the memory cell, which results in an electric charge being held by the memory cell, thus allowing modulation of the voltage distributions produced by the memory cell. Precisely controlling the amount of the electric charge stored by the memory cell allows to establish multiple threshold voltage levels corresponding to different logical levels, thus effectively allowing a single memory cell to store multiple bits of information: a memory cell operated with $2^n$ different threshold voltage levels is capable of storing n bits of information.

In FIG. 2, each graph 220A-220N shows a voltage distribution produced by memory cells programmed by a respective write level (which can be assumed to be at the midpoint of the distribution) to encode a corresponding logical level (e.g., "000" through "111" in case of a TLC). In order to distinguish between neighboring distributions (corresponding to two different logical levels), the read threshold voltage levels (shown by dashed vertical lines) are defined, such that any measured voltage that falls below a threshold level is associated with one distribution of the pair of neighboring distributions, while any measured voltage that is greater than or equal to the threshold level is associated with another distribution of the pair of neighboring distributions.

As seen from comparing example charts 210 and 230, which reflect the time periods immediately after programming and a respective number of hours after programming, respectively, the voltage distributions change in time due to the slow charge loss, which results in drifting values of the read threshold voltage levels, which are shown by dashed vertical lines. In various embodiments of the present disclosure, the temporal voltage shift is selectively tracked for programmed pages or blocks grouped by block families, and appropriate voltage offsets, which are based on page or block affiliation with a certain block family, are applied to the base read levels in order to perform read operations.

Figure 3:
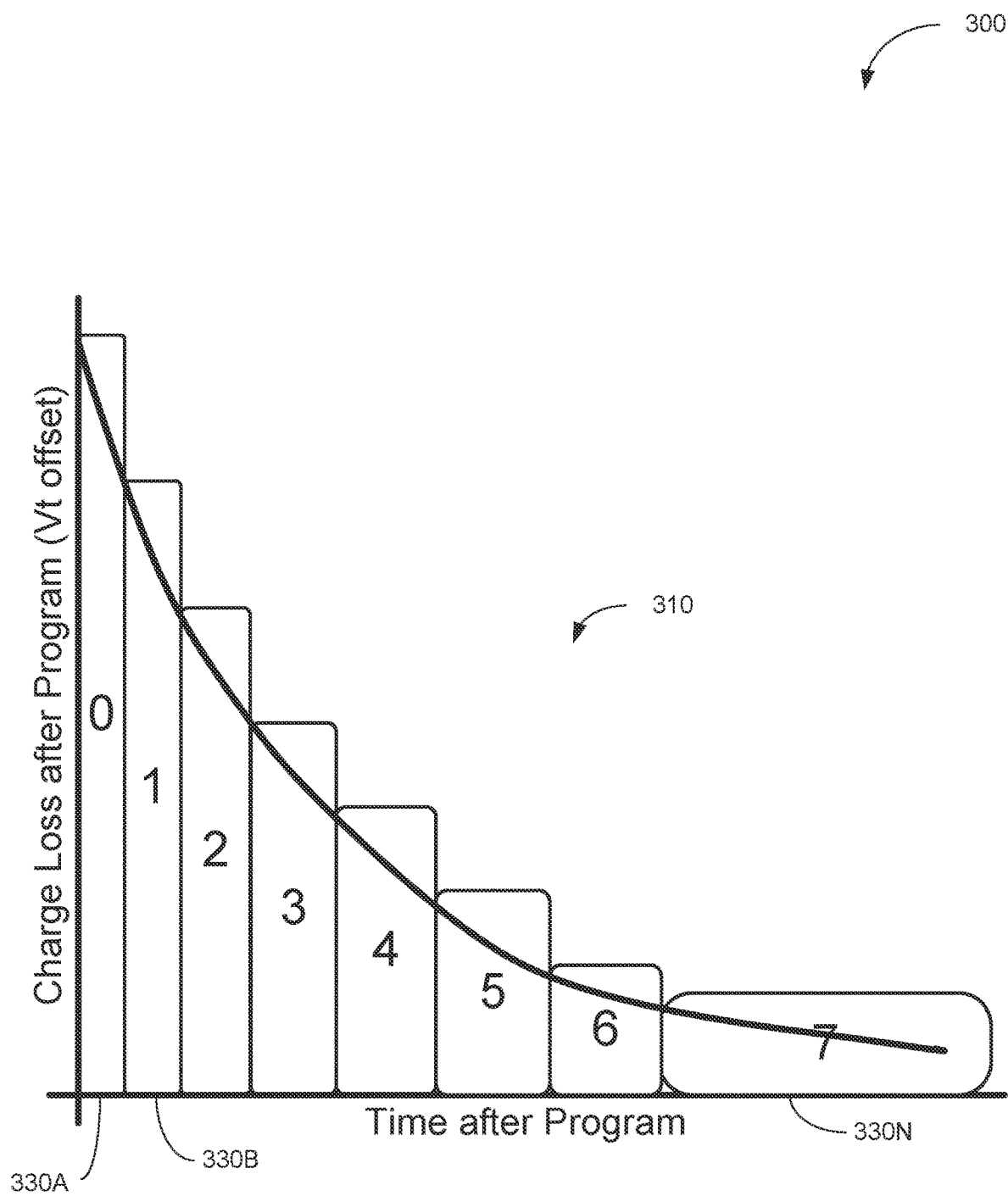
FIG. 3 depicts an example graph illustrating the dependency of the threshold voltage offset on the time after program (i.e., the period of time elapsed since the block had been programmed, in accordance with some embodiments of the present disclosure.

FIG. 3 depicts an example graph illustrating the dependency of the threshold voltage offset on the time after program (i.e., the period of time elapsed since the page had been programmed, in accordance with some embodiments of the present disclosure. As schematically illustrated by FIG. 3, block families of the memory device are grouped into bins 330A-330N, such that each block family includes one or more pages or blocks that have been programmed within a specified time window and a specified temperature window. As noted herein above, since the time elapsed after programming and temperature are the main factors affecting the temporal voltage shift, all pages, blocks, and/or partitions within a single block family 310 are presumed to exhibit similar distributions of threshold voltages in memory cells, and thus would require the same voltage changes for read operations.

Block families can be created asynchronously with respect to page programming events. In an illustrative example, the memory sub-system controller 115 of FIG. 1 can create a new block family whenever a specified period of time (e.g., a predetermined number of minutes) has elapsed since creation of the last block family or whenever the reference temperature of memory cells, which is updated at specified time intervals, has changed by more than a specified threshold value since creation of the current block family.

A newly created block family can be associated with a particular bin (e.g., bin 0, bin 1, etc.). Then, the memory sub-system controller can periodically perform a calibration process in order to associate each die of every block family with one of the predefines voltage bins (bins 0-7 in the illustrative example of FIG. 3), which is in turn associated with the voltage offset to be applied for read operations. The associations of blocks with block families and block families and dies with voltage bins can be stored in respective metadata tables maintained by the memory sub-system controller.

Figure 4:
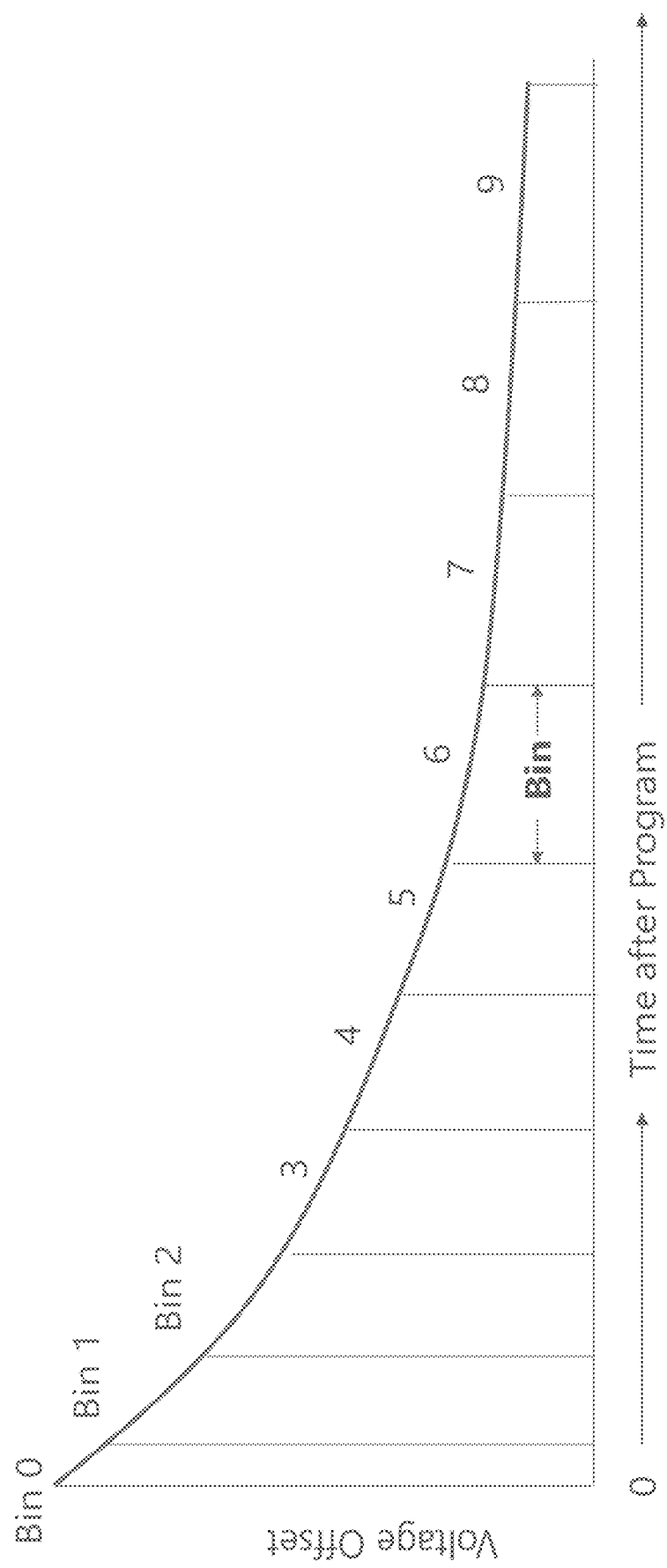
FIG. 4 schematically illustrates a set of predefined threshold voltage offset bins, in accordance with embodiments of the present disclosure.

FIG. 4 schematically illustrates a set of predefined threshold voltage offset bins (referred to as voltage bins or bins herein), in accordance with embodiments of the present disclosure. As schematically illustrated by FIG. 4, the threshold voltage offset graph can be subdivided into multiple voltage bins, such that each voltage bin corresponds to a predetermined range of threshold voltage offsets. While the illustrative example of FIG. 4 defines ten voltage bins for a single valley, in other implementations, various other numbers of voltage bins can be employed.

The memory sub-system controller can associate each die of every block family with a voltage bin, based on a periodically performed calibration process. The calibration process defines a set of threshold voltage offsets to be applied to the base voltage read level in order to perform read operations. In some embodiments, the calibration process involves performing, with respect to a specified number of randomly selected pages or blocks within the block family that is being calibrated, read operations utilizing different threshold voltage offsets, and choosing the threshold voltage offset that minimizes the error rate (e.g., a bit error rate) of the read operation. In other or similar embodiments, the calibration process involves sampling memory pages (i.e., measuring an access voltage distribution for memory cells of a memory page) of a block family and determining an amount voltage distribution shift from an access voltage distribution for the block family immediately or soon after programming. Further details regarding the calibration process are provided with respect to FIGS. 7 and 9.

Figure 5:
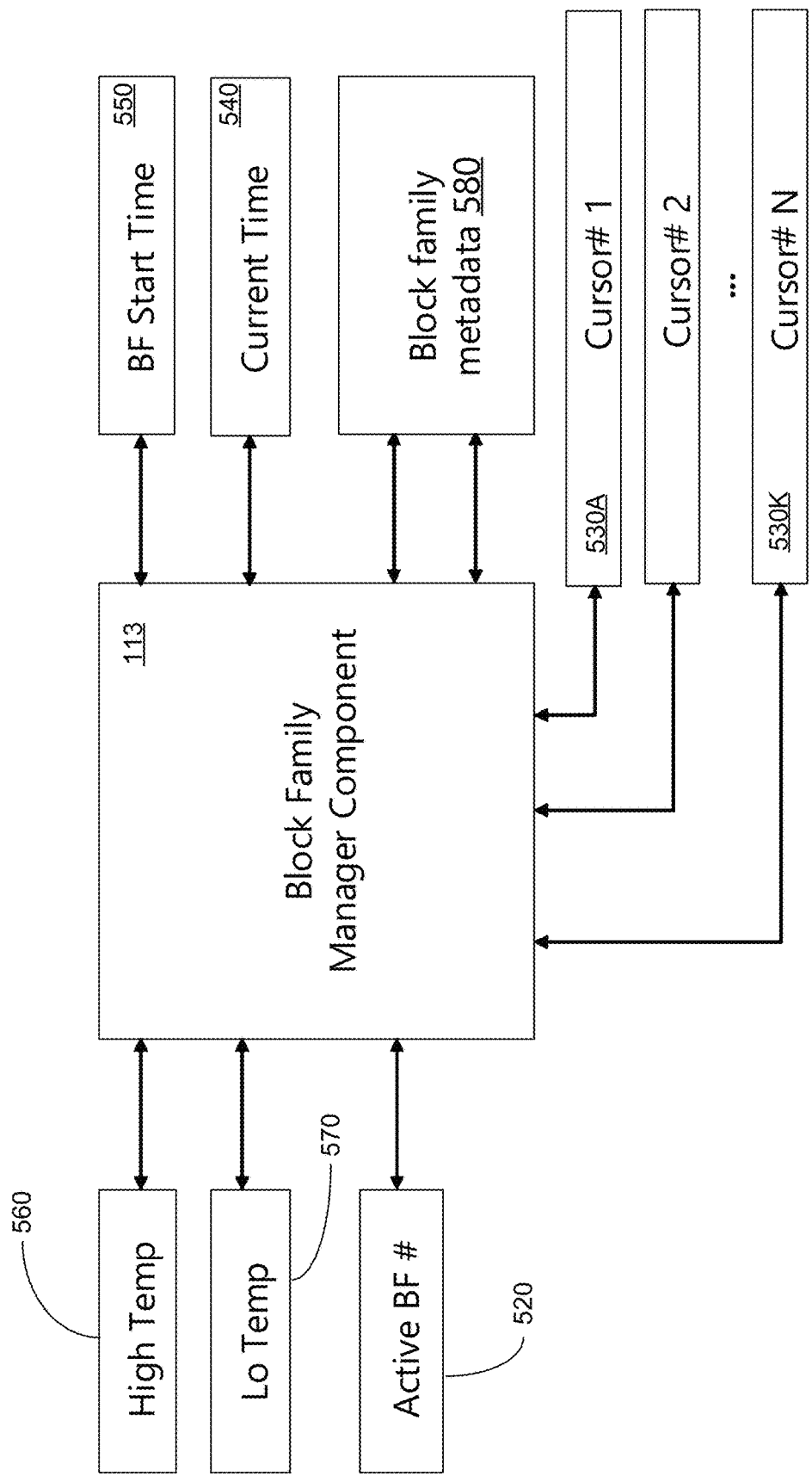
FIG. 5 illustrates block family management operations implemented by a block family manager component, in accordance with embodiments of the present disclosure.

FIG. 5 schematically illustrates block family management operations implemented by the block family manager component 113 of the memory sub-system controller 115, in accordance with embodiments of the present disclosure. As schematically illustrated by FIG. 5, the block family manager component 113 can maintain, in a memory variable, an identifier 520 of the active block family, which is associated with one or more pages or blocks of cursors 530A-530K as they are being programmed. "Cursor" herein shall broadly refer to a location on the memory device to which the data is being written.

The memory sub-system controller can utilize a power on minutes (POM) clock for tracking the creation times of block families. In some implementations, a less accurate clock, which continues running when the controller is in various low-power states, can be utilized in addition to the POM clock, such that the POM clock is updated based on the less accurate clock upon the controller wake-up from the low-power state.

Thus, upon initialization of each block family, block family manager component 113 stores the current time 540 in a memory variable as the block family start time 550. As the pages or blocks are programmed, block family manager component 113 compares the current time 540 to the block family start time 550. Responsive to detecting that the difference of the current time 540 and the block family start time 550 is greater than or equal to the specified time period (e.g., a predetermined number of minutes), block family manager component 113 updates the memory variable storing the active block family identifier 520 to store the next block family number (e.g., the next sequential integer number), and the memory variable storing the block family start time 550 is updated to store the current time 540.

The block family manager component 113 also maintains two memory variables for storing the high and low reference temperatures of a selected die of each memory device. Upon initialization of each block family, the high temperature 560 and the low temperature 570 variable store the value of the current temperature of the selected die of the memory device. In operation, while the active block family identifier 520 remains the same, temperature measurements are periodically obtained and compared with the stored high temperature 560 and the low temperature 570 values, which are updated accordingly: should the temperature measurement be found to be greater than or equal to the current value stored by the high temperature variable 560, the high temperature variable 560 is updated to store that temperature measurement; conversely, should the temperature measurement be found to fall below the current value stored by the low temperature variable 570, the low temperature variable 570 is updated to store that temperature measurement.

The block family manager component 113 can further periodically compute the difference between the high temperature 560 and the low temperature 570. Responsive to determining that the difference between the high temperature 560 and the low temperature 570 is greater than or equal to a specified temperature threshold, the block family manager component 113 can close the existing block family and can create a new active block family: the memory variable storing the active block family identifier 520 is updated to store the next block family number (e.g., the next sequential integer number), the memory variable storing the block family start time 550 is updated to store the current time 540, and the high temperature 560 and the low temperature 570 variables are updated to store the value of the current temperature of the selected die of the memory device. At the time of programming a block, block family manager component 113 associates the block with the currently active block family. The association of each block with a corresponding block family is reflected by the block family metadata 580.

As described previously, based on a periodically performed calibration process (e.g., a calibration scan), the block family manager component 113 associates each die of every block family with a respective voltage bin, which defines a respective set of threshold voltage offsets to be applied to the base voltage read level in order to perform read operations. In some embodiments, the calibration process involves sampling memory cells for a memory page of a block family to measure a current voltage distribution for the memory page. In some embodiments, the current voltage distribution can correspond to an average distribution for a set of sampled memory cells at a time period the calibration process is performed (i.e., at a current time period). In other or similar embodiments, the current voltage distribution can be a different aggregate measure.

In some embodiments, block family manager component 113 can determine an amount of shift of the memory cells for the memory page based on the current voltage distribution and a prior voltage distribution for the block family. In some embodiments, the prior voltage distribution can correspond to a voltage distribution measured for the memory page at a prior time period, such as, e.g., when data for the memory page is programmed at the memory device. In such embodiments, block family manager component 113 can determine the amount of voltage shift of the memory cells for the memory page based on a difference between the current voltage distribution and the prior voltage distribution. The determined amount of voltage shift can correspond to a threshold voltage offset that is previously determined (e.g., based on experimental data, etc.) to minimize the error rate of operations, such as read operations, performed for the block family. Block family manager 113 can determine the particular voltage bin that corresponds to the threshold voltage offset and update metadata for the block family to correspond to the determined voltage bin. In other or similar embodiments, block family manager component 113 can determine the amount of voltage shift of the memory cells using a reference voltage, in accordance with embodiments provided herein.

An operating temperature of a memory device at the current time period can be different from the operating temperature of the memory device at a prior time period, in some instances. For example, the operating temperature of the memory device when the data for a memory page is programmed can be different from the operating temperature of the memory device when the block family manager component 113 performs the calibration process. The difference in the operating temperature of the memory device between the time the memory page is programmed (i.e., an initial time period) and the time the memory page is accessed or calibrated is referred to as a cross-temperature. The operating temperature of the memory device can impact an amount of slow charge loss exhibited by memory cells of the memory device. Accordingly, a memory page associated with a large cross-temperature between the initial time period and the current time period can exhibit a different amount of voltage distribution shift, compared to memory cells of a memory page that is associated with a small cross-temperature.

In some embodiments, memory device 130, 140 can experience one or more temporary temperature swings during the overall lifetime of the memory device. For example, a memory device can operate at a first temperature for a significant portion (e.g., 90%, 95%, etc.) of the memory device lifetime and, for a small portion (e.g., 5%, 10%, etc.) of the memory device lifetime, the operating temperature of the memory device can deviate from the first temperature to one or more other temperatures. In some instances, the memory sub-system controller 115 can program a block family while memory device 130, 140 is operating at a first temperature and block family manager component 113 can initiate a calibration process for the block family while the memory device is subject to the temporary temperature swing (i.e., the memory device is temporarily operating at a second temperature). In other instances, memory sub-system controller 115 can program the block family while memory device 130, 140 is subject to the temporary temperature swing and block family manager component 113 can initiate the calibration process while the memory device is operating at the first temperature. In both instances, at the time the calibration process is initiated, memory cells of the memory page can exhibit a large (or small) amount of voltage distribution shift based on the cross-temperature of the memory page. In some embodiments, block family manager component 113 can apply a temporary voltage shift offset to the amount of voltage distribution shift measured for the memory page to obtain an adjusted amount of voltage distribution shift, in accordance with embodiments described below. In such embodiments, block family manager component 113 can assign a block family to a particular voltage bin based on the adjusted amount of voltage distribution shift for a memory page.

In some embodiments, the frequency at which the memory sub-system controller performs the calibration process for each voltage bin can be based on an age of the block families associated with the voltage bin. As described previously with respect to FIG. 3, newly created block families can be associated with voltage bin 0 and older block families on the memory device can be associated with subsequently numbered voltage bins. The temporal voltage shift for block families in a younger voltage bin is faster than the temporal voltage shift for block families associated with an older voltage bin. This is illustrated in FIG. 4, as the voltage offset for bin 0 shifts at quicker rate than the voltage offset for older voltage bins (e.g., voltage bins 9, 8, 7, etc.). Therefore, the memory sub-system controller can perform the calibration process for block families associated with voltage bin 0 at a higher frequency than for block families associated with voltage bin 9 to associate each block family with an appropriate voltage bin.

Figure 6:
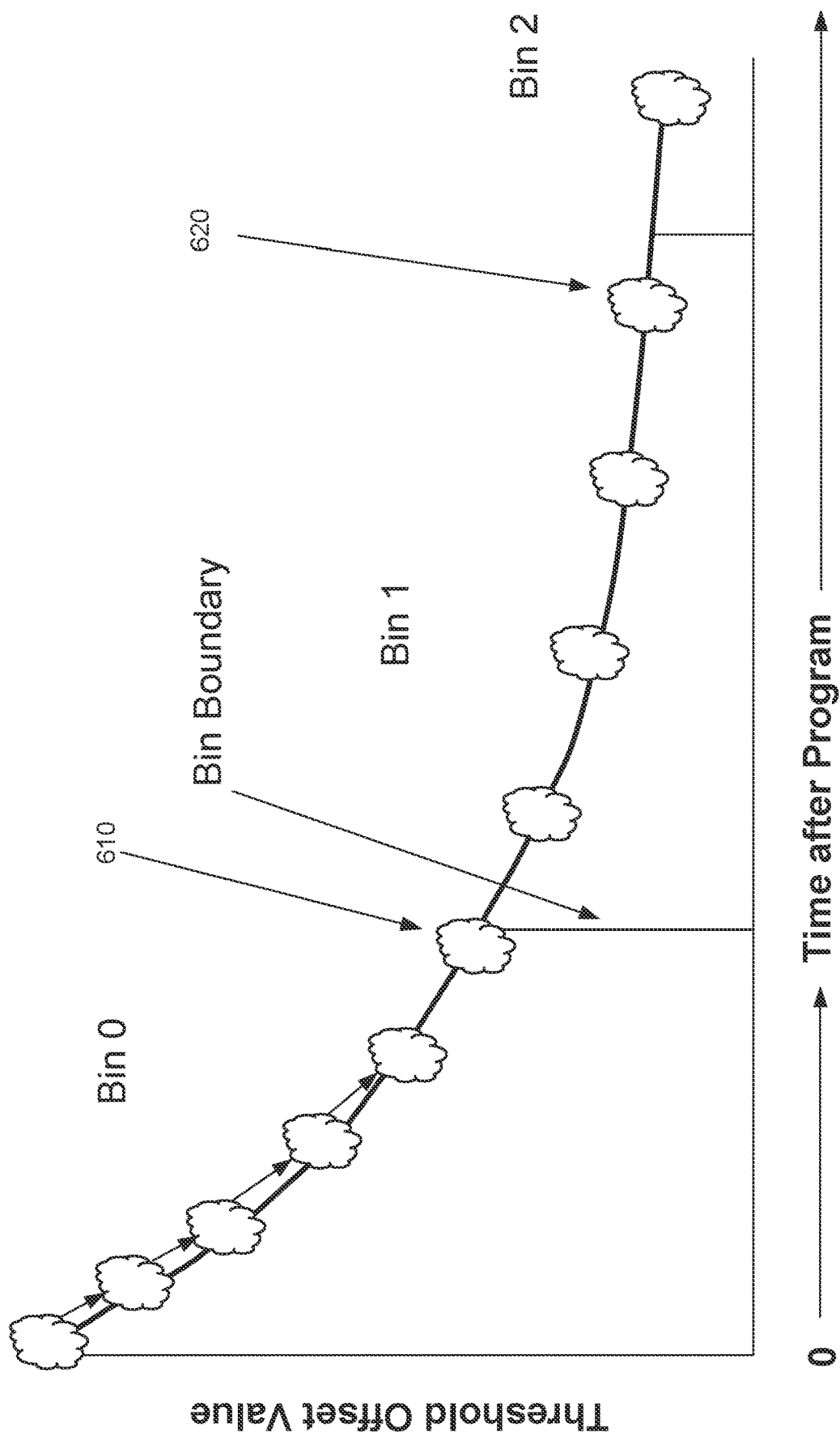
FIG. 6 schematically illustrates selecting block families for calibration, in accordance with embodiments of the present disclosure.

FIG. 6 schematically illustrates selecting block families for calibration, in accordance with embodiments of the present disclosure. Due to slow charge loss, the oldest block families in a voltage bin can migrate to the next voltage bin before other block families of the current bin. As such, the memory sub-system controller can limit calibration operations to the oldest block families in a bin (e.g., block family 610 in bin 0 and block family 620 in bin 1). In some embodiments, the memory sub-system controller can identify the oldest block family in a voltage bin based on a bin boundary for the bin. A bin boundary can represent a boundary between two adjacent block families that are each associated with a different bin. The memory sub-system controller can identify the bin boundary for a particular voltage bin using a block family metadata table.

Referring back to FIG. 1, block family manager component 113 can be configured to periodically calibrate a memory device 130, 140 to associate block families with an appropriate voltage bin in view of an adjusted amount of temporal voltage shift. The block family can be associated with a first voltage distribution at a first time period (also referred to a prior time period herein) immediately or soon after data is programmed or written to memory pages of the block family. In some embodiments, memory device 130, 140 can be operating at a first temperature as the data is programmed or written to the memory pages. During a second time period subsequent (also referred to as a current time period herein) to the first time period, the block family manager component 113 can determine that a calibration criterion is satisfied for the block family (e.g., that a threshold amount of time has passed since the block family is created, a threshold number of program/erase (P/E) cycles are reached for the block family, etc.). Block family manager 113 can perform a calibration operation (e.g., a calibration scan) for a memory page of the block family to measure an amount of voltage shift for memory cells of the memory page. Block family manager 113 can also determine a difference between an operating temperature of memory device 130, 140 at the second time period and the operating temperature of memory device 130, 140 at the first time period and can obtain a temporary voltage shift offset based on the determined difference. In some embodiments, the temporary voltage shift offset can be defined based on experimental and/or testing data collected for memory device 130, 140 prior to installation and/or initialization of memory device 130, 140. In other or similar embodiments, block family manager component 113 can generate the temporary voltage shift offset based on an amount of voltage shift measured for other memory pages of the block family and/or other block families during a temporary temperature swing of memory device 130, 140. Block family manager 113 can apply the temporary voltage shift offset to the measured amount of voltage shift for the memory cells to determine an adjusted amount of voltage shift for the memory cells. Block family manager component 113 can associate the block family including the memory page with an appropriate voltage bin associated with a temporal voltage offset that corresponds to the adjusted amount of temporal voltage shift. Further details regarding the calibration process are provided with respect to FIGS. 7-10B herein.

Figure 7:
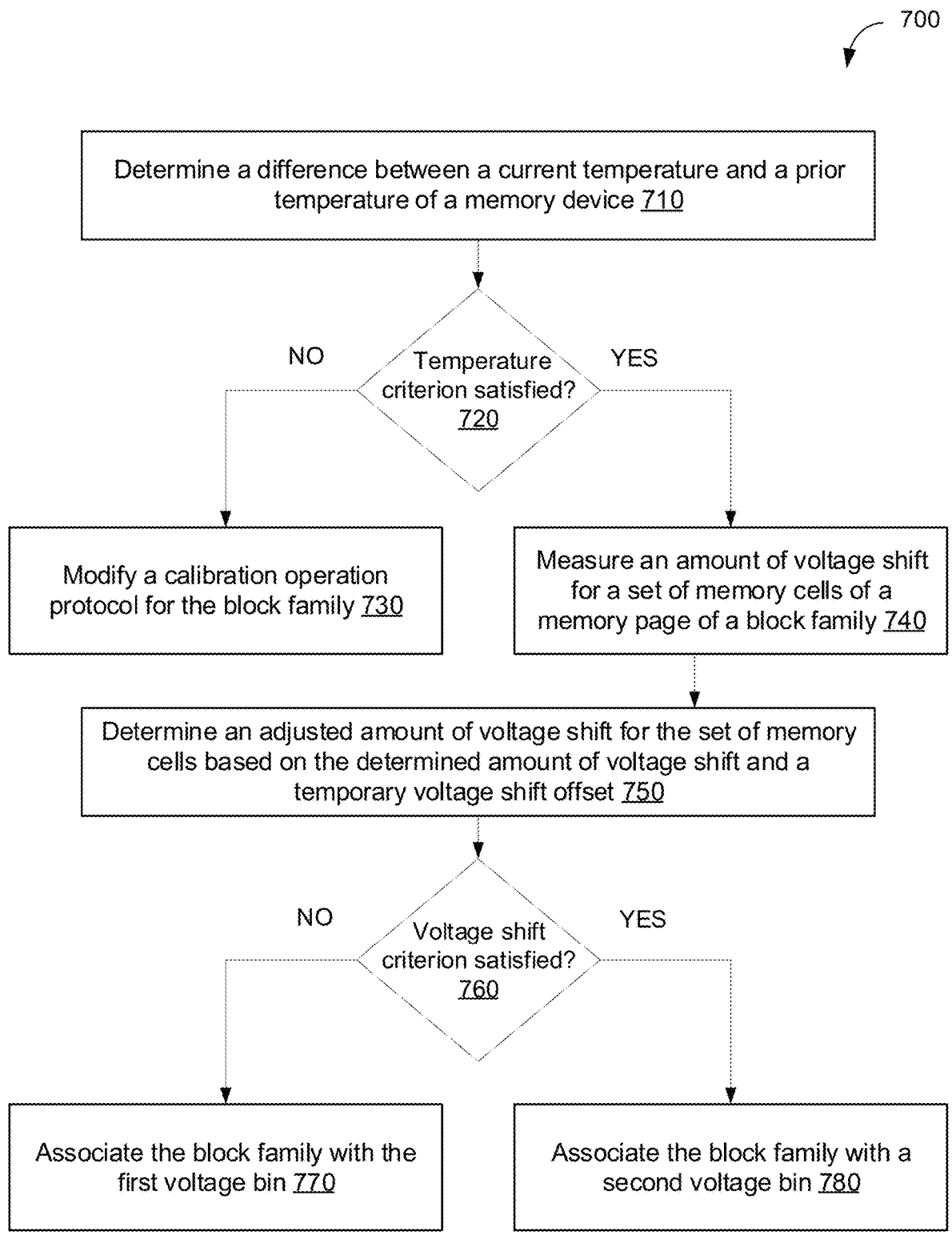
FIG. 7 is a flow diagram of an example method for voltage bin calibration based on a cross-temperature voltage shift offset, in accordance with some embodiments of the present disclosure.

FIG. 7 is a flow diagram of an example method 700 for voltage bin calibration based on a cross-temperature voltage shift offset, in accordance with some embodiments of the present disclosure. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by the block family manager component 113 of FIG. 1. In other or similar embodiments, one or more operations of method 700 is performed by another component of the memory sub-system controller, such as a block family manager (e.g., block family manager component 113). Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 710, processing logic determines a difference between a current temperature and a prior temperature of a memory device. As described above, data can be programmed to a memory page at a memory device, such as memory device 130, 140 of FIG. 1. While data is programmed to the memory page (i.e., at a first time period), memory device 130, 140 can be associated with an operating temperature. In some embodiments, the operating temperature can correspond to an operating temperature for memory device 130, 140 during a significant portion (e.g., 90%, 95%, etc.) of a lifetime of the memory device (referred to as a normal operating temperature or a standard operating temperature). In other or similar embodiments, the operating temperature can correspond to an operating temperature of memory device 130, 140 during a temporary temperature swing. As described above, a temporary temperature swing refers to a deviation of the operating temperature of memory device 130, 140 from a normal or standard operating temperature (referred to as an abnormal temperature or a outlier temperature) for a short portion (e.g., 5%, 10%, etc.) of the lifetime of the memory device. In some embodiments, memory device 130, 140 can be subject to a temporary temperature swing in response to a change in an environment surrounding memory device 130, 140. For example, during a significant portion of a lifetime of memory device 130, 140, memory device 130, 140 can operate in a first environment with an ambient temperature of between approximately 25-30 degrees Celsius (C). Memory device 130, 140 can be moved to a second environment with an ambient temperature of between approximately 65-70° C. (e.g., moved into a trunk of an automobile sitting in full sun exposure) for a short period of time and then subsequently moved back to the first environment. The movement of memory device 130, 140 from the first environment to the second environment for the short period of time is referred to as the temporary temperature swing. In some embodiments, a memory sub-system controller (e.g., memory sub-system controller 115) can program data to a memory page while memory device 130, 140 is operating in the second environment (i.e., while memory device 130, 140 is operating at an abnormal or outlier temperature).

Memory sub-system controller 115 can store data associated with an operating temperature of memory device 130, 140 for memory pages programmed at memory device 130, 140. For example, during or soon after programming data for a memory page, memory sub-system controller 115 can obtain an operating temperature of memory device 130, 140 from a temperature sensor of memory sub-system 110 and store the obtained operating temperature at a memory for memory sub-system controller and/or memory device 130, 140 (e.g., at local memory 119). In other or similar embodiments, memory sub-system controller 115 can store data associated with the operating temperature of memory device 130, 140 for one or more sets of memory page programmed to memory device 130, 140, rather than for each individual memory page. For example, memory sub-system controller 115 can program multiple memory pages to memory device 130, 140 during a fixed time interval and can obtain (e.g., from the temperature sensor of memory sub-system 110) an operating temperature of memory device 130, 140 at an initial period of the time interval and/or a final period of the fixed time interval. Memory sub-system controller 115 can generate one or more mappings between the obtained temperature and an address for each memory page programmed during the fixed time interval and store the mapping for each memory page at local memory 119. In some embodiments, the operating temperature of memory device 130, 140 can be the temperature used by block family manager component 113 to define a block family including a respective memory page, as described with respect to FIG. 5.

At a second time period, processing logic can initiate a calibration process for a block family of memory device 130, 140. As the second time period can be subsequent to the first time period (i.e., when data for the memory page is programmed to memory device 130, 140), the second time period can be referred to as a current time period and the first time period can be referred to as a prior time period, in accordance with some embodiments provided herein. The block family can be included in a first voltage bin, of a set of voltage bins, which is associated with a first threshold voltage offset, as described above. In some embodiments, processing logic can initiate the calibration process in view of a calibration protocol for the block family. For example, processing logic can initiate the calibration process for the block family in response to determining that a calibration criterion for the block family is satisfied. In some embodiments, processing logic can determine that a calibration criterion for a block family is satisfied in response to determining that an amount of time that has passed since the block family was created satisfies (e.g., meets or exceeds) a threshold amount of time In other or similar embodiments, processing logic can determine that the calibration criterion is satisfied in response to determining that a number of P/E cycles associated with the block family satisfies a threshold number of P/E cycles. In response to determining that the calibration criterion for the block family is satisfied, memory device can select a memory page of the block family to perform one or more calibration process operations (e.g., a calibration scan operation). Processing logic can select the memory page of the block family for the calibration operation(s) in view of the calibration protocol for the block family, in some embodiments.

In response to selecting the memory page of the block family, processing logic can obtain the operating temperature for the memory page at the prior time period (i.e., the prior temperature of memory device 130, 140). Processing logic can retrieve the prior temperature for the memory page from local memory 119, in accordance with previously described embodiments. Processing logic can also determine an operating temperature of memory device 130, 140 at the current tine period (referred to as the current temperature of memory device 130, 140). In some embodiments, the current temperature can correspond to an operating temperature during a temporary temperature swing for memory device 130, 140. In other or similar embodiments, the current temperature can correspond to a normal operating temperature or a standard operating temperature for memory device 130, 140, as described above.

Processing logic can obtain the current temperature for memory device 130, 140 as described above, in some embodiments. For example, in some embodiments, in response to determining that the calibration criterion with respect to the block family is satisfied, process logic can obtain the current operating temperature for memory device 130, 140 from the temperature sensor of memory sub-system 110. In another example, memory sub-system controller 115 can obtain the current operating temperature for memory device 130, 140 from the temperature sensor of memory sub-system 110 and store the current operating temperature at local memory 119. Process logic can retrieve the current operating temperature from local memory 119.

At block 720, processing logic can determine whether the difference between the prior temperature and the current temperature of memory device 130, 140 satisfies a temperature criterion. In some embodiments, processing logic can determine that the temperature criterion is satisfied by determining that the difference between the prior temperature and the current temperature of memory device 130, 140 falls below a temperature difference threshold. The temperature difference threshold can correspond to a value for a cross-temperature for the memory page where it is determined (e.g., based on experimental data and/or testing data for memory device 130, 140) that a calibration operation cannot be successfully performed to accurately assign the block family to a voltage bin associated with an accurate threshold voltage offset. For example, processing logic can determine that a difference between a prior temperature (e.g., 15° C.) and a current temperature (e.g., 90° C.) of memory device 130, 140 approximately corresponds to 75° C. A user of a manufacturing and/or testing system for memory device 130, 140 can define the temperature difference threshold for memory device 130, 140 as 70° C. in response to determining, based on experimental and/or testing data collected for memory device 130, 140, that processing logic cannot accurately assign a voltage bin to a block family associated with a cross-temperature above 70° C. Accordingly, processing logic can determine that the temperature criterion is satisfied in response to determining that the difference between the prior and current temperature associated with memory page of the block family that is selected for calibration exceeds the temperature difference threshold of 70° C. In other or similar embodiments, the temperature difference threshold can be defined based on data collected for memory device 130, 140 during operation of memory sub-system 115.

In response to processing logic determining that the temperature criterion is satisfied, method 700 can continue to operation 730, where processing logic can modify the calibration protocol for the block family. In some embodiments, processing logic can modify the calibration protocol to delay one or more calibration operations for the selected memory page of the block family. For example, processing logic can modify the calibration protocol to delay the calibration operation(s) for the selected memory page of the block family for a particular amount of time and after the particular amount of time passes, processing logic can initiate the calibration operation(s) for the selected memory page. In another example, processing logic can modify the calibration protocol to delay the calibration operation(s) for the selected memory page until a current operating temperature (i.e., the second temperature) for the memory device corresponds to a target temperature. The target temperature can be a temperature that is determined to satisfy the temperature criterion (e.g., the difference between the prior temperature and the target temperature falls below the temperature difference threshold). In response to determining that the current temperature for memory device 130, 140 corresponds to the target temperature, processing logic can initiate the calibration operation(s) for the selected memory page. In other or similar embodiments, processing logic can modify the calibration operation protocol to select another memory page of the block family to perform the one or more calibration operations. For example, processing logic can determine that the prior time period for the originally selected memory page includes or falls within a time period of a temporary temperature swing for memory device 130, 140. Accordingly, processing logic can select another memory page of the block family that was not programmed within the time period of the temporary temperature swing to perform the one or more calibration operations.

In response to processing logic determining that the temperature criterion is satisfied, method 700 can continue to operation 740, where processing logic measures an amount of voltage shift for a set of memory cells of the selected memory page. It should be noted that, in some embodiments, processing logic can perform operation 740 before performing operation 710. For example, processing logic can initiate the calibration process by measuring the amount of voltage shift of the set of memory cells, as described herein. Processing logic can subsequently determine the difference between the temperature at the current time period and the prior time period, as described above.

In some embodiments, processing logic can measure an amount of voltage shift for the set of memory cells by performing one or more calibration operations to measure a voltage distribution for the memory cells at the current time period (referred to as a current voltage distribution). Processing logic can measure the current voltage distribution for the memory page by sampling the memory page to determine the memory access voltage associated with each memory cell of the set of memory cells. In some embodiments, the set of memory cells can include all memory cells of the memory page or can include fewer than all memory cells of the memory page. The current voltage distribution can represent a difference the memory access voltage for one or more of the cells of the memory page at the time period that the measurement is obtained for the memory page.

In other or similar embodiments, processing logic can determine the amount of voltage shift for the memory cells using a reference voltage. A reference voltage can correspond to a particular point (e.g., a tail end) or a particular quantile (e.g., a 50% quantile) of a voltage distribution for a respective logical level of memory cells at a memory device. At a time period immediately or soon after programming a block family (e.g., at the prior time period), the memory pages of the block family can be associated with a particular voltage distribution (referred to as a prior voltage distribution). In one example, the reference voltage can correspond to a voltage for memory cells at a tail end of the voltage distribution. A voltage for memory cells associated with the tail end of the prior memory access voltage distribution can approximately correspond to a threshold voltage used by the memory sub-system controller to program data to the memory cells (referred to as the programming voltage or the program verify (PV) voltage). As such, a value of the reference voltage associated with the prior voltage distribution (referred to as the prior value of the reference voltage) corresponds to the programming voltage for the memory cells. In another example, the reference voltage can correspond to a voltage for memory cells at a particular quantile (e.g., a 50% quantile) of the voltage distribution.

Processing logic can measure the current voltage distribution for the memory cells of the selected memory page, as described above, and determine a current value for the reference voltage based on the current voltage distribution. For example, if the reference voltage corresponds to a tail end of a voltage distribution, the current value for the reference voltage can correspond to a voltage measured for the tail end of the current voltage distribution. In some embodiments, processing logic can determine the amount of shift of the memory cells based on a difference between the value for the prior reference voltage and the current reference voltage.

At operation 750, processing logic determines an adjusted amount of voltage shift for the set of memory cells based on the determined amount of voltage shift and a temporary voltage shift offset. In some embodiments, processing logic can determine the adjusted amount of voltage shift for the set of memory cells by obtaining the temporary voltage shift offset and applying the temporary voltage shift offset to the amount of voltage shift measured for the set of memory cells, as described with respect to operation 740. In some embodiments, processing logic can obtain the temporary voltage shift offset from a temporary voltage shift offset data structure, such as data structure 800 illustrated in FIG. 8. Data structure 800 includes a set of entries 810 that each include a memory page cross temperature difference field 812 and a temporary voltage shift offset field 814.

The cross temperature difference field 812 of each entry 810 can indicate a value or a range of values associated with a difference between a prior temperature and a current temperature of a memory page of memory device 130, 140, as described above. The temporary voltage shift offset field 814 of each entry 810 can indicate a temporary voltage shift offset that is to be applied to a measured voltage shift for a memory page in view of the cross temperature for the memory page. In some embodiments, each temporary voltage shift offset can be determined based on experimental and/or testing data collected for memory device 130, 140 before memory device 130, 140 is installed and/or initialized at memory sub-system 110. A temporary voltage shift offset for an entry 810 can correspond to an amount of voltage shift that is determined to be caused by a cross-temperature within the range of cross temperatures indicated in the cross-temperature difference field 812 of the entry 810.

In one example, during a testing process for a set of memory devices associated with memory device 130, 140, data for a memory page can be programmed at a first memory device while the first memory device is operating at a first temperature of 20° C. In some instances, the ambient temperature of the first memory device can be significantly increased to a second temperature (e.g., 80° C.). In other or similar instances, the ambient temperature of the first memory device can be significantly decreased to a second temperature (e.g., 0° C.). A first amount of voltage shift for the memory page can be measured while the first memory device the memory device is operating at the second temperature. Data for the memory page can be programmed at a second memory device while the second memory device is operating at the first temperature of 20° C. In some instances, the ambient temperature of the second memory device is maintained at approximately the first temperature (e.g., maintained at a temperature of between approximately 18° C. and 22° C.). A second amount of voltage shift for the memory page can be measured while the second memory device is maintained at the first temperature. In some embodiments, a processing device of the testing facility can determine a difference between the first amount of voltage shift and the second amount of voltage shift and generate a mapping of the determined difference to a value of a cross temperature. The value of the cross temperature can represent the difference between the first temperature of the first and second device and the second temperature for the first memory device. The difference between the first amount of voltage shift and the second amount of voltage shift can correspond to an amount of voltage shift that is caused by the value for the cross temperature mapped to the difference. The generated mapping can be included in data structure 800, which can be stored at memory (e.g., local memory 119, memory device 130, 140) for one or more memory sub-systems tested at the testing facility (e.g., memory sub-system 110).

Figure 8:
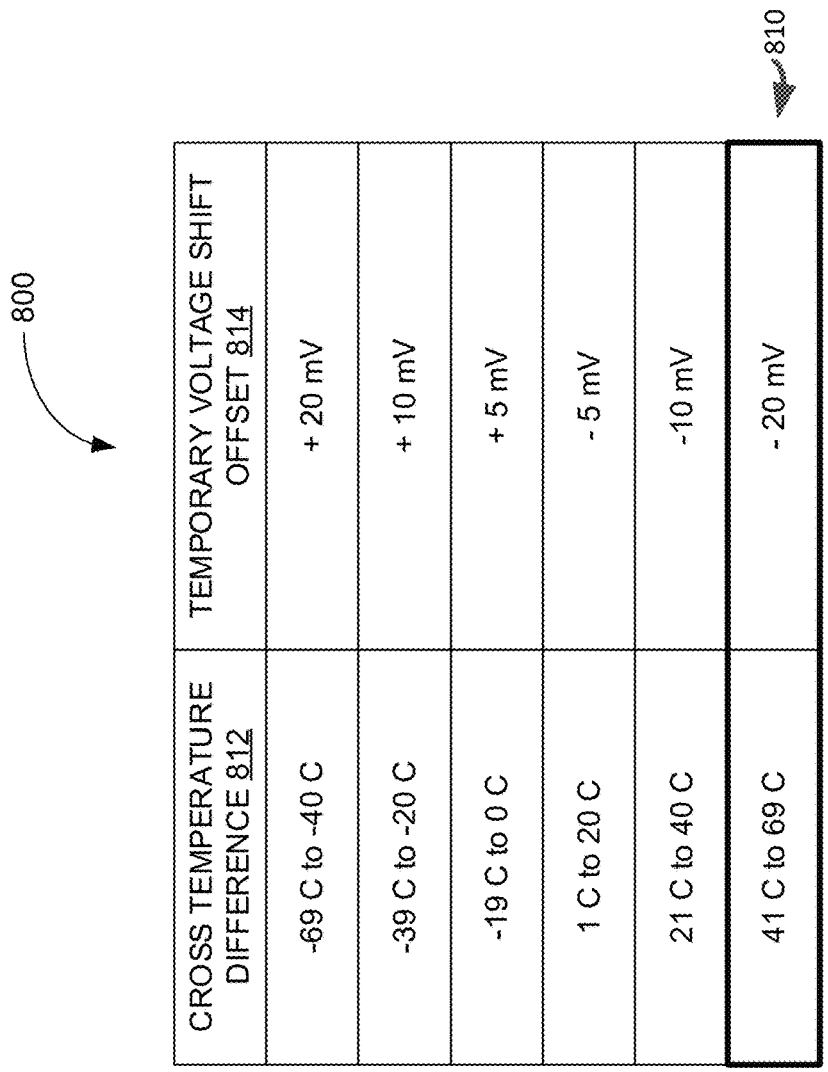
FIG. 8 illustrates an example of determining an adjusted voltage shift for memory cells using a cross-temperature voltage shift offset, in accordance with some embodiments of the present disclosure.

Processing logic can identify an entry of data structure 800 that includes a value in the cross temperature difference field 812 that correspond to the difference between the prior temperature and the current temperature for the selected memory page, as described above. In an illustrative example, as illustrated in FIG. 8, the prior temperature 816 associated with the selected memory page can be 20° C. and the current temperature 818 associated with the selected memory page can be 70° C. Accordingly, a difference between the prior temperature and the current temperature associated with the selected memory page is approximately 50° C. Processing logic can identify an entry 810 of data structure 800 that includes a value or a range of values for the cross temperature difference field 812 that corresponds to the determined difference of approximately 50° C. Processing logic can obtain the temporary voltage shift offset to be applied to the measured voltage shift for the selected memory page by extracting the value included in the temporary voltage shift offset field 814 of the identified entry 810. As illustrated in FIG. 8, the measured voltage shift 820 for the selected memory page is approximately 30 millivolts (mV) and the temporary voltage shift offset from field 814 of the identified entry 810 is approximately −20 mV. Processing logic can apply the obtained temporary voltage shift offset of −20 mV to the measured voltage shift 820 to determine the adjusted voltage shift 822 of approximately 10 mV for the selected memory page.

Referring back to FIG. 7, at operation 760, processing logic determines whether the adjusted amount of voltage shift for the selected memory page satisfies a voltage shift criterion. In some embodiments, processing logic determines that the adjusted amount of voltage shift satisfies the voltage shift criterion in response to determining that the adjusted amount of voltage shift meets or exceeds a threshold amount of voltage shift. Similarly, processing logic can determine that the adjusted amount of voltage shift does not satisfy the voltage shift criterion in response to determining the adjusted amount of voltage shift does not exceed the threshold amount of voltage shift. In response to processing logic determining that the voltage shift criterion is not satisfied, method 700 can continue to operation 770, where processing logic can associate the block family including the selected memory page with the first voltage bin. In response to processing logic determining that the voltage shift criterion is satisfied, method 700 can continue to operation 780, where processing logic can associate the block family including the selected memory page with a second voltage bin. The second voltage bin can correspond to a second threshold voltage offset that is different from the first threshold voltage offset that corresponds to the first voltage bin. In some embodiments, processing logic can associate the block family with the second voltage bin by updating a pointer to a voltage bin boundary for the second voltage bin, as previously described. For example, processing logic can update a metadata table for the block family including the memory page to indicate that the pointer for the second voltage bin to corresponds with the block family.

Figure 9:
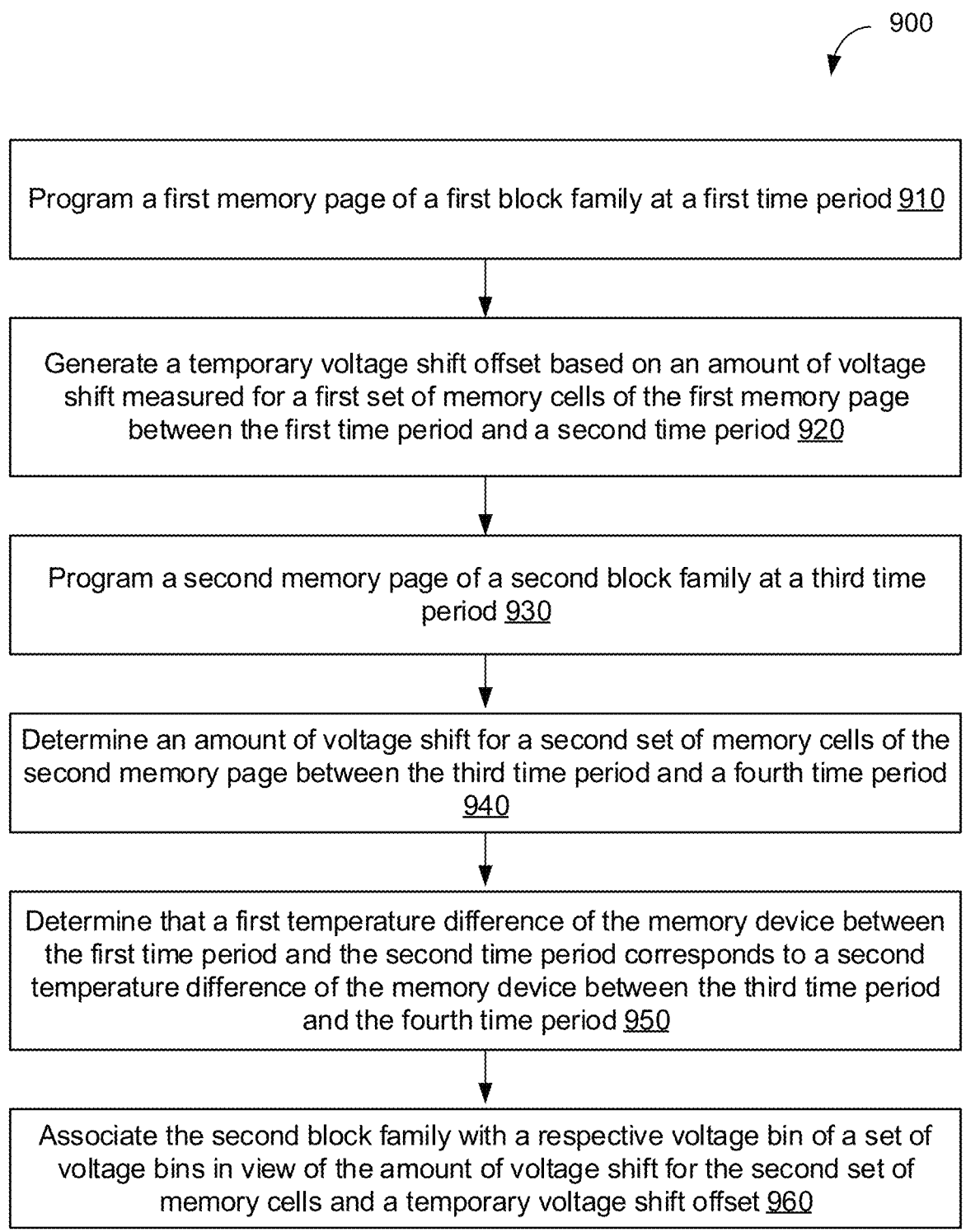
FIG. 9 is a flow diagram of another example method for voltage bin calibration based on a cross-temperature voltage shift offset, in accordance with some embodiments of the present disclosure.

FIG. 9 is a flow diagram of another example method for voltage bin calibration based on a cross-temperature voltage shift offset, in accordance with some embodiments of the present disclosure. The method 900 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 900 is performed by the block family manager component 113 of FIG. 1. In other or similar embodiments, one or more operations of method 900 is performed by another component of the memory sub-system controller, such as a block family manager. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 910, process logic programs a first memory page of a first block family of memory device 130, 140 at a first time period. Memory device 130, 140 can be operating at a first temperature when processing logic programs the first memory page. For example, memory device 130, 140 can be operating at a temperature that corresponds to a normal or standard operating temperature for memory device 130, 140, as previously described. In another example, memory device 130, 140 can be subject to a temporary temperature swing and therefore can be operating at a temperature that corresponds to an abnormal or outlier operating temperature.

At operation 920, processing logic generates a temporary voltage shift offset for memory device 130, 140 based on an amount of voltage shift measured for a first set of memory cells of the first memory page between the first time period and a second time period. The temporary voltage shift offset can be associated with a first temperature difference of memory device 130, 140 between the first and second time periods. In some embodiments, processing logic can determine to generate the temporary voltage shift offset based on an outcome of a calibration process performed for the first memory page. For example, processing logic can initiate the calibration process in view of a calibration protocol for memory device 130, 140, as described herein. In response to initiating the calibration process, processing logic can measure the amount of voltage shift by performing a calibration operation (e.g., a calibration scan) to obtain a current voltage threshold distribution for the first set of memory cells and can determine the amount of voltage shift based on a difference between the current voltage threshold distribution and a prior voltage threshold distribution for the memory cells, as described above. In another example, processing logic can measure the amount of voltage shift using a reference voltage for a prior and current threshold voltage distribution of the memory cells, also described above.

Processing logic can determine whether to generate the temporary voltage by determining whether the measured amount of voltage shift for the first set of memory cells satisfies a temporary voltage shift criterion. Processing logic can determine that the measured amount of voltage shift satisfies the temporary voltage shift criterion by determining that the measurement amount of voltage shift exceeds an expected amount of voltage shift between the first time period and the second time period. In some embodiments, the expected amount of voltage shift can be determined based on experimental and/or testing data collected for memory device 130, 140 prior to installation and/or initialization of memory device 130, 140 at memory sub-system 110. In other or similar embodiments, the expected amount of voltage shift can be determined based on an amount of voltage shift observed for memory pages of memory device 130, 140 during time period intervals that correspond to the amount of time between the first time period and the second time period.

In some embodiments, processing logic can further determine that the temporary voltage shift criterion is satisfied by determining whether the first temperature difference of memory device 130, 140 between the first time period and the second time period exceeds a temperature swing criterion. Processing logic can obtain the first temperate for the memory device 130, 140 from a memory of memory sub-system 110 (e.g., from local memory 119), as described above. Processing logic can obtain a second temperature of the memory device 130, 140 from a temperature sensor of the memory sub-system 110, or from a memory of memory sub-system 110, as described herein. In some embodiments, processing logic can determine that the first temperature difference of memory device 130, 140 exceeds the temperature swing criterion in response to determining that the first temperature difference exceeds a threshold difference value. The threshold difference value can indicate to a maximum temperature difference between two or more time periods at memory device 130, 140 that correspond to a normal or standard operating characteristic of memory device 130, 140. A temperature difference between two or more time periods that exceeds the threshold difference value can indicate that memory device 130, 140 is subject to an abnormal or non-standard operating condition, such as a temporary temperature swing. In some embodiments, the threshold difference value can be determined based on experimental and/or testing data for memory device 130, 140, as described herein.

In other or similar embodiments, processing logic can determine that the temperature swing criterion is satisfied based on another temperature difference for memory device 130, 140 between the first time period and an intermediate time period. For example, the first time period can include an interval of time between approximately 0 s and 10 s and the second time period can include an interval of time between approximately 500 s and 530 s. Processing logic can determine the first temperature difference for memory device 130, 140 between the first time period and the second time period, as described above. Processing logic can further determine an intermediate temperature difference for memory device 130, 140 between the first time period and an intermediate time period that includes an interval of time between approximately 120 s and 150 s. Processing logic can determine whether the intermediate temperature difference between the first time period and the intermediate time period exceeds the threshold difference value described above. In response to determining that the intermediate temperature difference does not exceed the threshold difference value (i.e., that the intermediate temperature difference does not correspond to a temporary temperature swing), processing logic can determine wither the first temperature difference of memory device 130, 140 between the first and second time period corresponds to the intermediate temperature difference. In some embodiments, processing logic can determine that the first temperature difference corresponds to the intermediate temperature difference by determining that the first temperature difference approximately equals (e.g., is the same or is similar to) the intermediate temperature difference.

In response to determining that the temporary voltage shift criterion is satisfied, processing logic can determine to generate the temporary voltage shift offset. In some embodiments, processing logic can generate the temporary voltage shift offset based on the measured amount of voltage shift for the first set of memory cells for the memory page and an expected amount of voltage shift for the memory page. For example, processing logic can determine from experimental and/or testing data for memory device 130, 140 an expected amount of voltage shift for the memory page between the first period and the second period when memory device 130, 140 is not subject to a temporary temperature swing. Processing logic can generate the offset by determining a difference between the expected amount of voltage shift and the measured amount of voltage shift and can generate a mapping between the offset and the difference between the first temperature and the second temperature of memory device 130, 140 between the first and second time periods. In other or similar embodiments, processing logic can generate the temporary voltage shift offset by re-measuring the amount of voltage shift for the first set of memory cells after the memory device is no longer subject to the temporary temperature swing. For example, processing logic can detect (e.g., via the temperature sensor for memory sub-system 110) that, at a time period subsequent to the second time period, the current temperature of memory device 130, 140 corresponds to the first temperature of memory device 130, 140. In response to detecting that the current temperature corresponds to the first temperature, processing logic can re-measure the amount of voltage shift for the first set of memory cells and can generate the temporary voltage shift offset based on a difference between the measured amount of voltage shift between the first period and the second time period and the amount of voltage shift measured between the first period and the subsequent time period. Processing logic can generate a mapping between the generated offset and the temperature difference between the first and second time periods, as described above.

FIG. 10A depicts generating a temporary voltage shift offset for memory device 130, 140, in accordance with some embodiments of the present disclosure. As illustrated in FIG. 10A, a first temperature 1010 for memory device 130, 140 can be approximately 20° C. and a second temperature 1012 for memory device 130, 140 can be approximately 70° C.

Processing logic can measure an amount of voltage shift for the first set of memory cells at the second time period and determine that the amount of voltage shift satisfies a temporary voltage shift criterion, as described above. The measured amount of voltage shift for the first set of memory cells is depicted as temporary voltage shift 1014 in FIG. 10A. Processing logic can determine that the estimated or actual voltage shift 1016 between the first time period and the second time period is approximately 10 mV, in accordance with embodiments described above. Processing logic can generate the temporary voltage shift offset by determining a difference between the temporary voltage shift 1014 and the expected or actual voltage shift 1016 and can generate a mapping between the generated offset and the temperature difference between the first and second time periods. In some embodiments, processing logic can store the generated mapping at a local memory of memory sub-system 110, such as local memory 119. In some embodiments, processing logic can store the generated mapping at a temporary voltage shift offset data structure, such as data structure 800 described with respect to FIG. 8. As illustrated in FIG. 10A, processing logic can add an entry 810 to data structure 800 that includes a value of 50° C. in the cross-temperature difference field 812 and a value of −30 mV in the temporary voltage offset field 814.

Referring back to FIG. 9, at operation 930, processing logic programs a second memory page of a second block family at a third time period. In some embodiments, the second memory page can be the same as the first memory page described with respect to operation 910. In other or similar embodiments, the second memory page can be different from the first memory page, however, the second block family can be the same as the first block family that includes the first memory page. In still other or similar embodiments, the second block family can be different from the first block family, however, the first block family and the second block family can be included at the same memory device 130, 140 of memory sub-system. In still other or similar embodiments, the first block family and the second block family can be included at separate memory device 130, 140. For example, the first block family can be included at memory device 130 and the second block family can be included at memory device 140. In some embodiments, the third time period can be after the first and second time periods. In other or similar embodiments, the third time period can be after the first time period and before the second time period. In still other or similar embodiments, the third time period can be before or can be the same as the first and/or second time periods.

At operation 940, processing logic determines an amount of voltage shift for a second set of memory cells of the second memory page between the third time period and a fourth time period. In some embodiments, the fourth time period can be before, between, or after the first and second time periods. Memory device 130, 140 can be operating at a third temperature during the third time period and can be operating at a fourth time period during the fourth time period, in some embodiments. In some embodiments, processing logic can determine the amount of voltage shift for the second set of memory cells by measuring the current amount of voltage shift for the second set of memory cells (i.e., by performing one or more calibration operations) in response to determining that a temperature criterion and/or a calibration criterion is satisfied, as described above.

At operation 950, processing logic determines that the first temperature difference of memory device 130, 140 between the first time period and the second time period corresponds to a second temperature difference of memory device 130, 140 between the third time period and the fourth time period. FIG. 10B depicts determining an adjusted voltage shift 1024 for the second set of memory cells, in accordance with embodiments of the present disclosure. As illustrated in FIG. 10B, a third temperature of memory device 130, 140 at the third time period is approximately 15° C. and a fourth temperature of memory device 130, 140 at a fourth time period is approximately 68° C. Processing logic can determine the difference between the third temperature 1018 and the fourth temperature 1020 to be approximately 53° C., in accordance with previously described embodiments. Processing logic can also measure the amount of voltage shift 1022 at the fourth time period to be approximately 35 mV, as previously described. Processing logic can determine whether the second temperature difference between the third temperature 1018 and the fourth temperature 1020 (i.e., approximately 53° C.) corresponds to the first temperature difference between the first temperature 1010 and the second temperature 1012 (i.e., approximately 50° C.). In some embodiments, processing logic can determine that the second temperature difference corresponds to the first temperature difference by determining that the second temperature difference equals or approximately equals the first temperature difference.

As illustrated in FIG. 10B, the difference between the first temperature difference and the second temperature difference is approximately 3° C. In some embodiments, processing logic can determine that a difference of approximately 3° C. makes the first temperature difference approximately equal to the second temperature difference (e.g., in view of experimental and/or testing data for memory device 130, 140). In such embodiments, processing logic can obtain the temporary voltage shift offset from local memory 119 and/or data structure 800, as described above. Referring back to FIG. 9, at operation 960, processing logic associates the second block family with a respective voltage bin of a set of voltage bins in view of the amount of voltage shift for the second set of memory cells and the temporary voltage shift offset. In some embodiments, processing logic can apply the obtained temporary voltage shift offset 814 to the measured voltage shift 1022 to determine an adjusted amount of voltage shift 1024 for the second set of memory cells and can associate the second block family with a respective voltage bin in view of the adjusted amount of voltage shift 1024, as described herein. In some embodiments, processing logic can assign the second block family to the respective voltage bin by associating the second block family with a respective voltage bin that corresponds to the adjusted amount of voltage shift for the second set of memory cells. For example, processing logic can update a pointer for a voltage bin boundary for the respective voltage bin to correspond with the block family. In other or similar embodiments, processing logic can determine that the difference of approximately 3° C. does not make the first temperature difference approximately equal to the second temperature difference and can generate an additional temporary voltage shift offset, in accordance with previously described embodiments.

Figure 11:
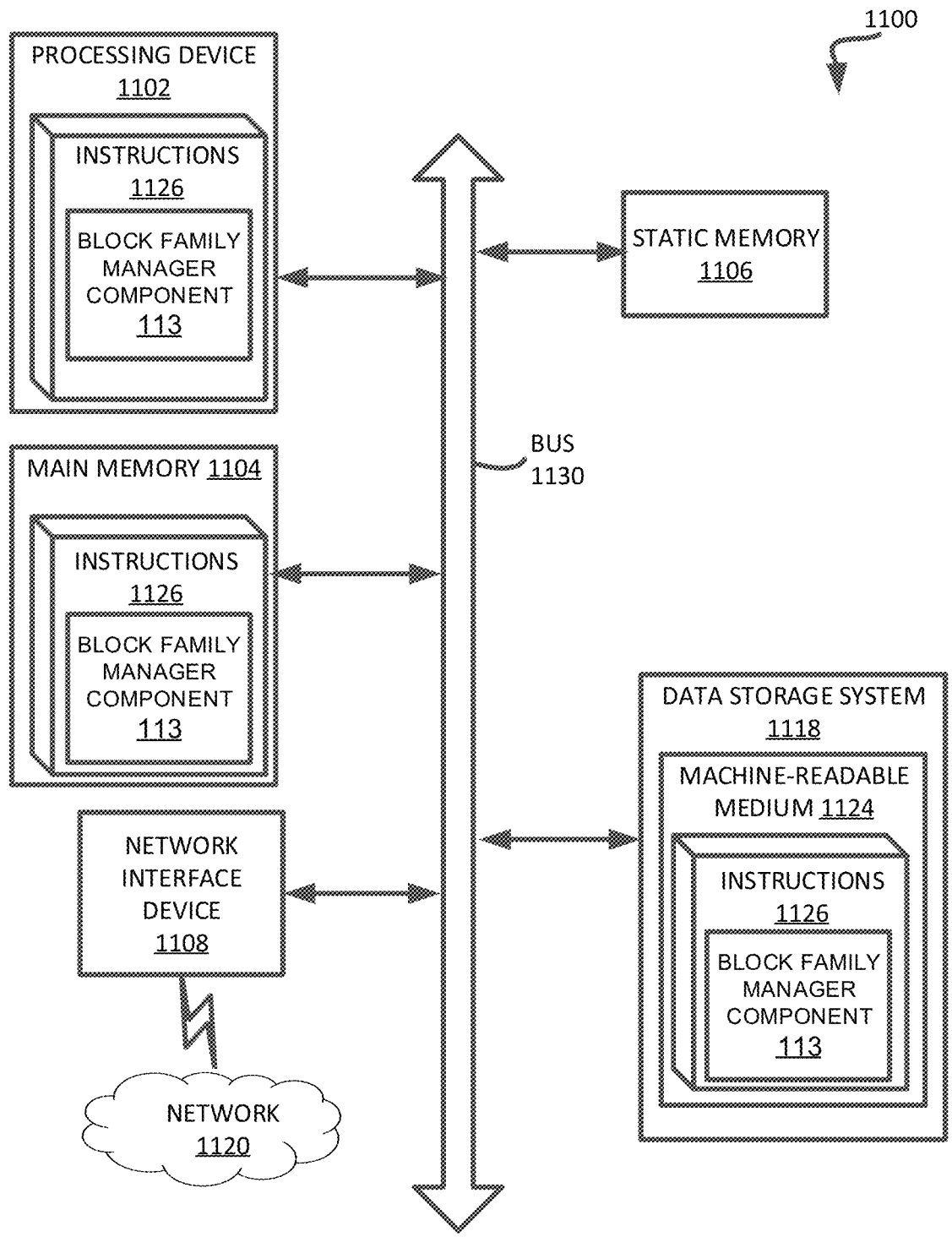
FIG. 11 is a block diagram of an example computer system in which embodiments of the present disclosure may operate.

FIG. 11 illustrates an example machine of a computer system 1100 within which a set of instructions, for causing the machine to perform any one or more of the methodologies discussed herein, can be executed. In some embodiments, the computer system 1100 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the block family manager component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1100 includes a processing device 1102, a main memory 1104 (e.g., read-only memory (ROM), flash memory, dynamic random access memory (DRAM) such as synchronous DRAM (SDRAM) or RDRAM, etc.), a static memory 1106 (e.g., flash memory, static random access memory (SRAM), etc.), and a data storage system 1118, which communicate with each other via a bus 1130.

Processing device 1102 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1102 can also be one or more special-purpose processing devices such as an application specific integrated circuit (ASIC), a field programmable gate array (FPGA), a digital signal processor (DSP), network processor, or the like. The processing device 1102 is configured to execute instructions 1126 for performing the operations and steps discussed herein. The computer system 1100 can further include a network interface device 1108 to communicate over the network 1120.

The data storage system 1118 can include a machine-readable storage medium 1124 (also known as a computer-readable medium) on which is stored one or more sets of instructions 1126 or software embodying any one or more of the methodologies or functions described herein. The instructions 1126 can also reside, completely or at least partially, within the main memory 1104 and/or within the processing device 1102 during execution thereof by the computer system 1100, the main memory 1104 and the processing device 1102 also constituting machine-readable storage media. The machine-readable storage medium 1124, data storage system 1118, and/or main memory 1104 can correspond to the memory sub-system 110 of FIG. 1.

In one embodiment, the instructions 1126 include instructions to implement functionality corresponding to a voltage bin boundary component (e.g., the block family manager component 113 of FIG. 1). While the machine-readable storage medium 1124 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
    measuring a voltage shift for memory cells of a block family at a memory device, wherein the block family is associated with a first voltage offset;
    determining an adjusted amount of voltage shift for the memory cells based on the measured voltage shift and a temporary voltage shift offset associated with a difference between a current temperature and a prior temperature for the memory device; and
    associating the block family with a second voltage offset in view of the adjusted voltage shift.

2. The method of claim 1, wherein the block family is associated with the second voltage offset in response to determining that the adjusted voltage shift satisfies a voltage shift criterion.

3. The method of claim 1, wherein the prior temperature of the memory device corresponds to a temperature of the memory device when data for the memory cells was written to the memory device.

4. The method of claim 1, wherein the difference between the current temperature and the prior temperature for the memory device is determined responsive to determining that a calibration criterion associated with the memory cells is satisfied.

5. The method of claim 1, wherein determining the adjusted amount of voltage shift comprises:
    identifying the temporary voltage shift offset from a temporary voltage shift offset data structure; and
    causing the temporary voltage shift offset to be applied to the measured amount of voltage shift for the memory cells.

6. The method of claim 5, wherein identifying the temporary voltage shift offset from the temporary voltage shift offset data structure comprises:
    identifying an entry of a plurality of entries of the temporary voltage shift offset data structure that corresponds to the difference between the current temperature and the prior temperature of the memory device; and
    extracting, from the identified entry, a value indicating the temporary voltage shift offset.

7. The method of claim 1, wherein the temporary voltage shift offset is determined based on experimental data collected for the memory device prior to initialization of the memory device.

8. The method of claim 1, wherein measuring the voltage shift for the memory cells comprises performing a calibration operation for the memory cells.

9. The method of claim 8, wherein the voltage shift for the memory cells is measured responsive to a determination that a difference between the current temperature and the prior temperature of the memory device satisfies a temperature criterion, and wherein the method further comprises:
    responsive to determining that the difference between the current temperature and the prior temperature of the memory device does not satisfy the temperature criterion, modifying a calibration protocol for the block family.

10. A system comprising:
    a memory device; and
    a processing device coupled to the memory device, the processing device to perform operations comprising:
        measuring a voltage shift for memory cells of a block family associated with a first voltage offset;
        determining an adjusted amount of voltage shift for the memory cells based on the measured voltage shift and a temporary voltage shift offset associated with a difference between a current temperature and a prior temperature for the memory device; and
        associating the block family with a second voltage offset in view of the adjusted voltage shift.

11. The system of claim 10, wherein the block family is associated with the second voltage offset in response to determining that the adjusted voltage shift satisfies a voltage shift criterion.

12. The system of claim 10, wherein the prior temperature of the memory device corresponds to a temperature of the memory device when data for the memory cells was written to the memory device.

13. The system of claim 10, wherein the difference between the current temperature and the prior temperature for the memory device is determined responsive to determining that a calibration criterion associated with the memory cells is satisfied.

14. The system of claim 10, wherein determining the adjusted amount of voltage shift comprises:
    identifying the temporary voltage shift offset from a temporary voltage shift offset data structure; and
    causing the temporary voltage shift offset to be applied to the measured amount of voltage shift for the memory cells.

15. The system of claim 14, wherein identifying the temporary voltage shift offset from the temporary voltage shift offset data structure comprises:
    identifying an entry of a plurality of entries of the temporary voltage shift offset data structure that corresponds to the difference between the current temperature and the prior temperature of the memory device; and
    extracting, from the identified entry, a value indicating the temporary voltage shift offset.

16. The system of claim 10, wherein the temporary voltage shift offset is determined based on experimental data collected for the memory device prior to initialization of the memory device.

17. A non-transitory computer-readable storage medium comprising instructions that, when executed by a processing device, cause the processing device to perform operations comprising:
    measuring a voltage shift for memory cells of a block family at a memory device, wherein the block family is associated with a first voltage offset;
    determining an adjusted amount of voltage shift for the memory cells based on the measured voltage shift and a temporary voltage shift offset associated with a difference between a current temperature and a prior temperature for the memory device; and associating the block family with a second voltage offset in view of the adjusted voltage shift.

18. The non-transitory computer-readable storage medium of claim 17, wherein the block family is associated with the second voltage offset in response to determining that the adjusted voltage shift satisfies a voltage shift criterion.

19. The non-transitory computer-readable storage medium of claim 17, wherein the prior temperature of the memory device corresponds to a temperature of the memory device when data for the memory cells was written to the memory device.

20. The non-transitory computer-readable storage medium of claim 17, herein the difference between the current temperature and the prior temperature for the memory device is determined responsive to determining that a calibration criterion associated with the memory cells is satisfied.

\* \* \* \* \*